United States Patent
Hsiao et al.

(10) Patent No.: US 9,064,988 B2
(45) Date of Patent: Jun. 23, 2015

(54) PHOTOELECTRIC DEVICE PACKAGE

(71) Applicant: Centera Photonics Inc., Hsinchu (TW)

(72) Inventors: Hsu-Liang Hsiao, Changhua County (TW); Guan-Fu Lu, Taichung (TW); Tzu-Ching Yeh, Hsinchu County (TW); Chun-Chiang Yen, Hsinchu (TW)

(73) Assignee: Centera Photonics Inc., Hsinchu (TW)

( * ) Notice: Subject to any disclaimer, the term of this patent is extended or adjusted under 35 U.S.C. 154(b) by 247 days.

(21) Appl. No.: 13/721,040

(22) Filed: Dec. 20, 2012

(65) Prior Publication Data
US 2013/0270427 A1  Oct. 17, 2013

(30) Foreign Application Priority Data

Apr. 16, 2012 (TW) .............. 101113484 A
Jun. 26, 2012 (TW) .............. 101122837 A

(51) Int. Cl.
| H01L 31/0232 | (2014.01) |
| H01L 23/12 | (2006.01) |
| H01L 31/0203 | (2014.01) |
| G02B 6/42 | (2006.01) |

(52) U.S. Cl.
CPC .......... *H01L 31/02327* (2013.01); *H01L 23/12* (2013.01); *H01L 31/0203* (2013.01); *G02B 6/428* (2013.01); *G02B 6/4253* (2013.01); *G02B 6/4206* (2013.01); *G02B 6/4214* (2013.01); *G02B 6/4243* (2013.01); *G02B 6/4244* (2013.01); *G02B 6/4245* (2013.01); *G02B 6/4246* (2013.01); *G02B 6/425* (2013.01); *G02B 6/4257* (2013.01); *H01L 2224/16225* (2013.01); *H01L 2224/48091* (2013.01); *H01L 2924/15311* (2013.01); *H01L 2924/1461* (2013.01)

(58) Field of Classification Search
CPC ........... H01L 2224/48091; H01L 2924/15311; H01L 2924/1461; H01L 2924/0014
See application file for complete search history.

(56) References Cited

U.S. PATENT DOCUMENTS

| 6,207,950 B1 * | 3/2001 | Verdiell ................. 250/239 |
| 8,853,000 B2 * | 10/2014 | Chen et al. ................. 438/106 |

FOREIGN PATENT DOCUMENTS

| TW | 200642521 | 12/2006 |
| TW | 200919699 | 5/2009 |
| TW | 201026135 | 7/2010 |
| TW | 201130111 | 9/2011 |

(Continued)

OTHER PUBLICATIONS

"Office Action of Taiwan Counterpart Application", issued on Mar. 10, 2014, p. 1-5.

(Continued)

*Primary Examiner* — Tony Ko
(74) *Attorney, Agent, or Firm* — Jianq Chyun IP Office

(57) ABSTRACT

A photoelectric device package and a detachable package structure are provided. The photoelectric device package includes a bottom-plate, a top-plate, at least one photoelectric device, and at least one light-guiding element. The bottom-plate has a first carrying part and a first substrate part on the first carrying part. The first carrying part has first alignment portions. The first substrate part has second alignment portions. The top-plate has a second carrying part and a second substrate part on the second carrying part. The second carrying part has third alignment portions. The second substrate part has fourth alignment portions. The top-plate and the bottom-plate are assembled by the first and third alignment portions. The first and second substrate parts are positioned by the second and fourth alignment portions. Each photoelectric device is disposed on the first substrate part. Each light-guiding element is disposed between the first and second substrate parts.

8 Claims, 15 Drawing Sheets

(56) References Cited

FOREIGN PATENT DOCUMENTS

| | | |
|---|---|---|
| TW | 201203501 | 1/2012 |
| TW | M426970 | 4/2012 |

OTHER PUBLICATIONS

"Office Action of Taiwan Counterpart Application", issued on Apr. 10, 2014, p. 1-6.

* cited by examiner

PHOTOELECTRIC DEVICE PACKAGE

CROSS-REFERENCE TO RELATED APPLICATION

This application claims the priority benefits of Taiwan application serial no. 101113484, filed on Apr. 16, 2012 and Taiwan application serial no. 101122837, filed on Jun. 26, 2012. The entirety of each of the above-mentioned patent applications is hereby incorporated by reference herein and made a part of this specification.

BACKGROUND OF THE INVENTION

1. Field of the Invention

The invention relates to a package and a package structure. More particularly, the invention relates to a photoelectric device package and a detachable package structure.

2. Description of Related Art

To enhance the endurance of electronic products and adapt the electronic products to different environments, dies or electronic devices are often enclosed by a package structure, so as to block external moisture or air. In addition, a package structure may also protect other types of products as well as improve their reliability and endurance.

With the flourishing development of photoelectric products, mature semiconductor manufacturing techniques have been applied to various photoelectric devices, so as to ensure microminiaturization and multi-functionality of these devices. The photoelectric devices made by conducting the semiconductor manufacturing techniques are applicable to optical high definition multimedia interfaces (HDMI), active optical cables/AOC transceivers, or other photoelectric conversion elements.

The way to package the photoelectric devices is one of the key factors that may affect the photoelectric devices, the yield thereof, and the package costs. To allow light to be transmitted between a light-guiding element (e.g., an optical fiber) and a light-emitting element (e.g., a laser diode or a light-emitting diode) or between a light-guiding element (e.g., an optical fiber) and a photo-sensitive element (e.g., a photo-diode) in the photoelectric device, the light-guiding element and the light-emitting element/the photo-sensitive element need be accurately aligned for performing subsequent packaging processes. However, the existing photoelectric devices are required to be manually aligned by using special clamping tools under a microscope, which not only raises the costs but also impairs the manufacturing reliability.

SUMMARY OF THE INVENTION

The invention is directed to a photoelectric device package and a detachable package structure, and the photoelectric device package with a dual alignment mechanism is able to achieve precise alignment, thus simplifying the packaging process of the photoelectric device. The detachable package structure may be easily disassembled, and thereby defective or dysfunctional elements of the package structure may be replaced.

In an embodiment of the invention, a photoelectric device package that includes a bottom-plate, a top-plate, at least one photoelectric device, and at least one light-guiding element is provided. The bottom-plate has a first carrying part and a first substrate part. The first carrying part has a plurality of first alignment portions. The first substrate part is disposed on the first carrying part and has a plurality of second alignment portions. The top-plate has a second carrying part and a second substrate part. The second carrying part has a plurality of third alignment portions. The top-plate and the bottom-plate are assembled by the first alignment portions and the third alignment portions. The second substrate part is disposed on the second carrying part and has a plurality of fourth alignment portions. The first substrate part and the second substrate part are positioned by the second alignment portions and the fourth alignment portions. The photoelectric device is disposed on the first substrate part and located between the first substrate part and the second substrate part. Here, the photoelectric device serves to emit or receive an optical signal. The light-guiding element is disposed between the first substrate part and the second substrate part, and the light-guiding element serves to transmit the optical signal.

In an embodiment of the invention, a detachable package structure that includes an assembly substrate, a first semiconductor substrate, a second semiconductor substrate, and a combination element is provided. The first semiconductor substrate is disposed on the assembly substrate and has a first alignment portion. The second semiconductor substrate has a second alignment portion. The combination element allows the first semiconductor substrate and the second semiconductor substrate to be detachably combined together, such that the first alignment portion and the second alignment portion are aligned and combined.

In an embodiment of the invention, a detachable package structure that includes a first substrate, a photoelectric conversion unit, a second substrate, an optical unit, and a combination element is provided. The photoelectric conversion unit is disposed on the first substrate and includes at least one of a light-emitting element and a photo-sensitive element. The optical unit is disposed between the first substrate and the second substrate and optically coupled to the photoelectric conversion unit. The combination element allows the first substrate and the second substrate to be detachably combined, so as to fix a relative position of the photoelectric conversion unit and the optical unit.

In view of the above, the top-plate and the bottom-plate of the photoelectric device package described in an embodiment of the invention are assembled by the third alignment portions of the second carrying part and the first alignment portions of the first carrying part, and the first substrate part and the second substrate part are precisely positioned by the fourth alignment portions of the second substrate part and the second alignment portions of the first substrate part. During the process, no additional element is required for alignment, and the reliability of the process may be improved. Besides, in the detachable package structure described in an embodiment of the invention, the combination element allows the first semiconductor substrate and the second semiconductor substrate to be detachably combined, and the first alignment portion and the second alignment portion are allowed to be aligned and combined. Hence, the detachable package structure described herein may be easily disassembled, so as to replace defective or dysfunctional elements in the package structure. Moreover, the combination element described in an embodiment of the invention allows the first substrate and the second substrate to be detachably combined, such that the relative position of the photoelectric conversion unit and the optical unit may be fixed. Due to the detachability of the detachable package structure, the photoelectric conversion unit and the optical unit in the package structure may be positioned, and the detachable package structure may be easily disassembled, so as to replace defective or dysfunctional elements in the package structure.

In order to make the aforementioned and other features and advantages of the invention more comprehensible, embodiments accompanying figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1A:
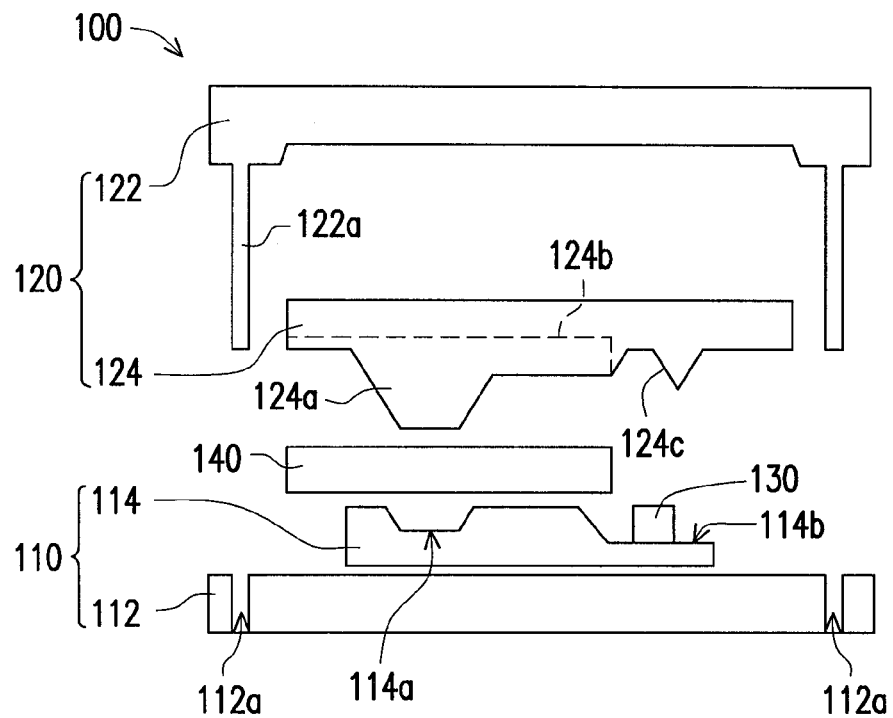
FIG. 1A is a schematic exploded side view illustrating a photoelectric device package according to an embodiment of the invention.

FIG. 1A is a schematic exploded side view illustrating a photoelectric device package according to an embodiment of the invention. With reference to FIG. 1A, the photoelectric device package 100 described in this embodiment includes a bottom-plate 110, a top-plate 120, at least one photoelectric device 130, and at least one light-guiding element 140. The bottom-plate 110 includes a first carrying part 112 and a first substrate part 114. The first carrying part 112 has a plurality of first alignment portions 112a. The first substrate part 114 has a plurality of second alignment portions 114a. The top-plate 120 has a second carrying part 122 and a second substrate part 124. The second carrying part 122 has a plurality of third alignment portions 122a. The second substrate part 124 has a plurality of fourth alignment portions 124a.

The photoelectric device 130 is disposed on the first substrate part 114 and located between the first substrate part 114 and the second substrate part 124. Here, the photoelectric device 130 serves to emit or receive an optical signal. Each light-guiding element 140 is disposed between the first substrate part 114 and the second substrate part 124 and serves to transmit the optical signal. In this embodiment, the second substrate part 124 has a plurality of grooves 124b. The light-guiding element 140 is disposed in the groove 124b. The light-guiding element 140 may be an optical fiber and may be fixed into the groove 124b by an ultraviolet adhesive or a thermal-curing adhesive. The first substrate part 114 has a recession 114b, and the photoelectric device 130 is disposed on a bottom surface of the recession 114b. The second substrate part 124 has a reflective surface 124c for reflecting the optical signal from the photoelectric device 130 or from the light-guiding element 140.

Figure 1B:
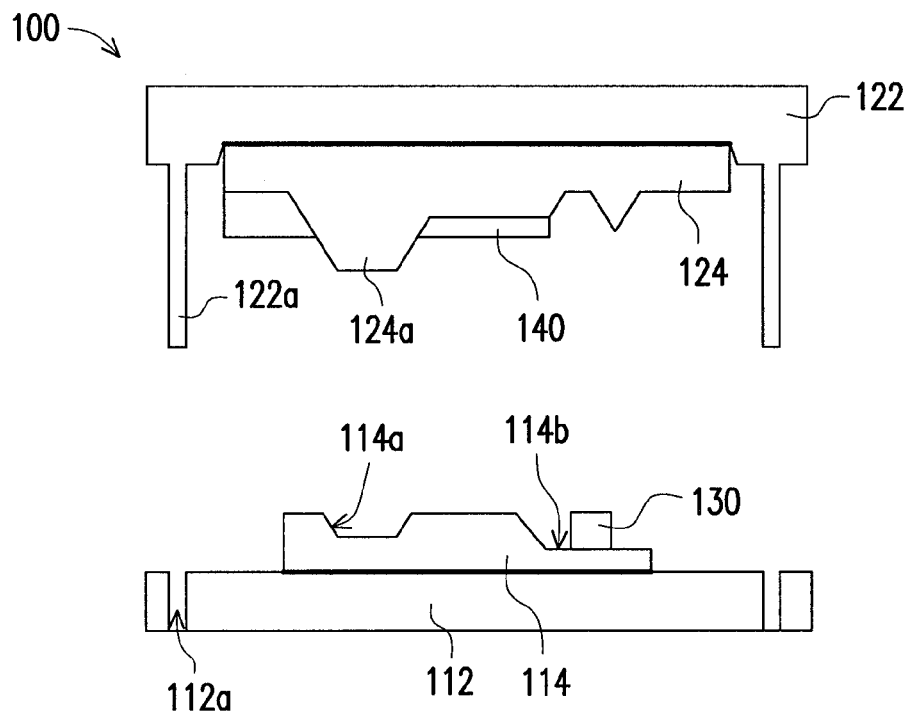
FIG. 1B is a schematic side view illustrating that the top-plate and the bottom-plate in the photoelectric device package depicted in FIG. 1A are not assembled yet.

FIG. 1B is a schematic side view illustrating that the top-plate and the bottom-plate in the photoelectric device package depicted in FIG. 1A are not assembled yet. With reference to FIG. 1B, the first substrate part 114 is disposed on the first carrying part 112. In this embodiment, the first substrate part 114 is precisely placed on the first carrying part 112 by a die-attach machine, and an alignment error between the first carrying part 112 and the first substrate part 114 is approximately ±15 micrometers. In addition, the first substrate part 114 may be a silicon substrate, and the second alignment portions 114a and the recession 114b may be formed on the silicon substrate by performing a standard silicon etching process. The first carrying part 112 may be a printed circuit board (PCB), a metal core printed circuit board (MCPCB), a ceramic circuit board, and so forth; however, the types of the first substrate part 114 and the first carrying part 112 are not limited thereto.

The second substrate part 124 is disposed on the second carrying part 122. The fourth alignment portions 124a of the second substrate part 124 may be formed by silicon etching or plastic injection molding, and the shape of the second carrying part 122 may correspond to the shape of the second substrate part 124 through injection molding. Thereby, the second substrate part 124 may be aligned to the second carrying part 122 and may be fixed into the second carrying part 122 through silver paste adhesion. Here, an alignment error between the second carrying part 122 and the second substrate part 124 is approximately +5 micrometers.

In this embodiment, the photoelectric device package 100 is assembled through the dual alignment mechanism, so as to simplify the packaging process of a conventional photoelectric device package which requires external equipment, and the highly precise packaging requirement may be satisfied in this embodiment. When the photoelectric device package 100 is to be assembled, as shown in FIG. 1B, the third alignment portions 122a of the second carrying part 122 may be aligned to the first alignment portions 112a of the first carrying part 112, so as to assemble the top-plate 120 and the bottom-plate 110. Here, an alignment error between the first carrying part 112 and the second carrying part 122 is approximately ±50 micrometers.

The fourth alignment portions 124a of the second substrate part 124 are then aligned to the second alignment portions 114a of the first substrate part 114, so as to position the first substrate part 114 and the second substrate part 124. In this embodiment, an alignment error between the first substrate part 114 and the second substrate part 124 is approximately ±5 micrometers. Note that the alignment error between the first carrying part 112 and the second carrying part 122 is greater than the alignment error between the first substrate part 114 and the second substrate part 124 according to this embodiment. In the photoelectric device package 100 described herein, the first and third alignment portions 112a and 122a are roughly positioned first, and the second and fourth alignment portions 114a and 124a are then accurately positioned.

Figure 1C:
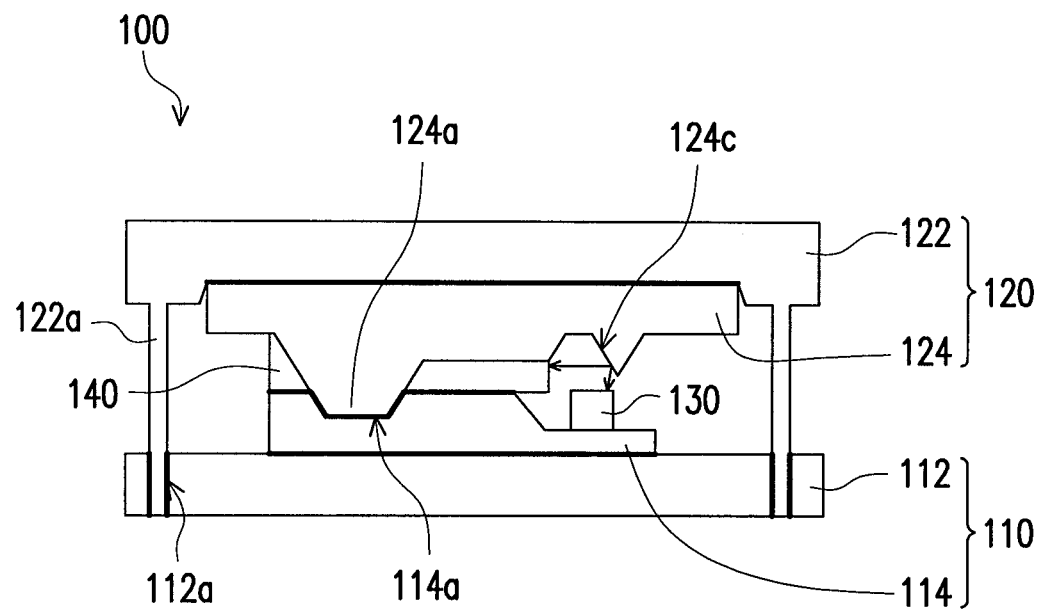
FIG. 1C is a schematic side view illustrating the photoelectric device package depicted in FIG. 1A.

FIG. 1C is a schematic side view illustrating the photoelectric device package depicted in FIG. 1A. With reference to FIG. 1C, the second carrying part 122 and the second substrate part 124 may then be fixed to the first carrying part 112 and the first substrate part 114, so as to complete the highly precise packaging process of the photoelectric device package. In this embodiment, the first alignment portions 112a are alignment holes, and the third alignment portions 122a are alignment pins. Besides, the second alignment portions 114a are alignment indentations and the fourth alignment portions 124a are alignment protrusions. Nonetheless, as long as the first and third alignment portions 112a and 122a may be matched, and the second and fourth alignment portions 114a and 124a may be matched, the types of the first, second, third, and fourth alignment portions 112a, 114a, 122a, and 124a are not limited to the above. During the entire assembly process, the top-plate 120 and the bottom-plate 110 of the photoelectric device package 100 described herein may be accurately aligned in no need of any additional equipment (e.g., a die-attach machine).

Figure 2:
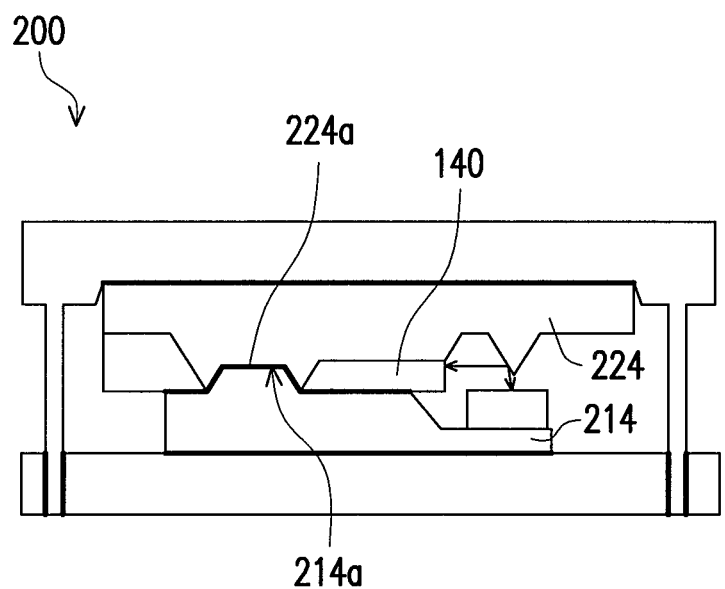
FIG. 2 is a schematic exploded side view illustrating a photoelectric device package according to another embodiment of the invention.

FIG. 2 is a schematic exploded side view illustrating a photoelectric device package according to another embodiment of the invention. With reference to FIG. 2, the difference between the photoelectric device package 200 described in this embodiment and the photoelectric device package 100 depicted in FIG. 1C lies in that the second alignment portions 214a of the photoelectric device package 200 depicted in FIG. 2 are alignment protrusions, and the fourth alignment portions 224a are alignment indentations. The first substrate part 214 and the second substrate part 224 are positioned by the alignment protrusions and the alignment indentations. Certainly, the types of the second alignment portions 214a and the fourth alignment portions 224a are not limited to the above.

Figure 3:
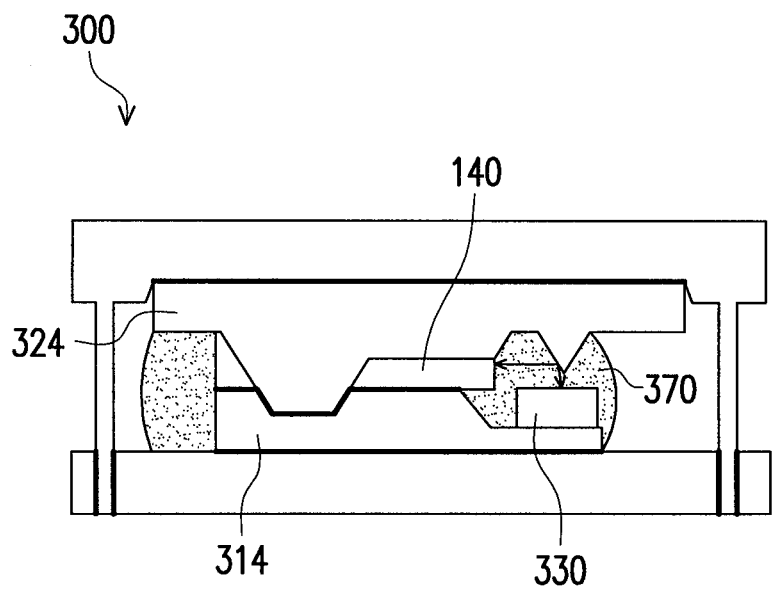
FIG. 3 is a schematic view illustrating a photoelectric device package according to another embodiment of the invention.

FIG. 3 is a schematic view illustrating a photoelectric device package according to another embodiment of the invention. With reference to FIG. 3, the difference between the photoelectric device package 300 described in this embodiment and the photoelectric device package 100 depicted in FIG. 1C lies in that the photoelectric device package 300 depicted in FIG. 3 further includes an optical adhesive 370 that fills a space between the first substrate part 314 and the second substrate part 324 to encapsulate the photoelectric device 330. The reflective index of the optical adhesive 370 is greater than the reflective index of air; hence, when light is emitted from the optical adhesive 370, the light may be converged to improve the coupling efficiency. In this embodiment, the optical adhesive 370 may be an ultraviolet adhesive or a thermal-curing adhesive. However, the types and the ingredients of the optical adhesive 370 are not limited herein.

Figure 4:
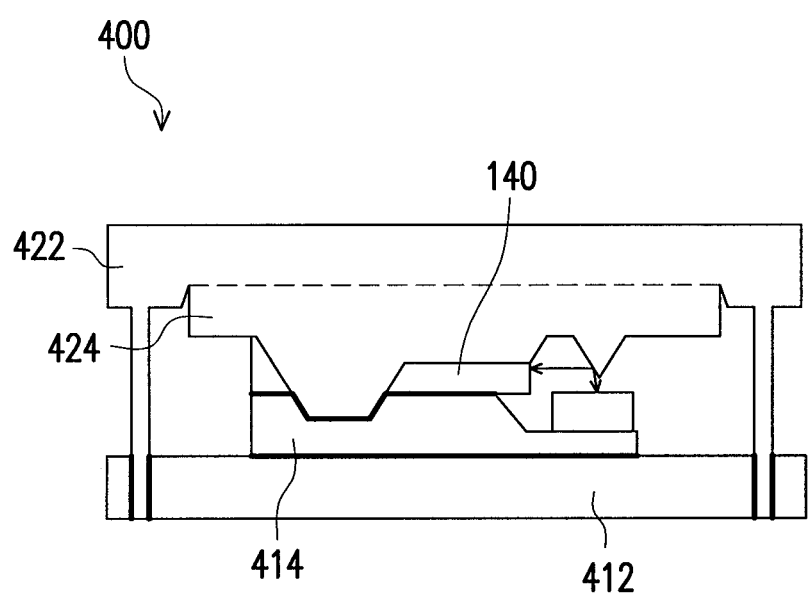
FIG. 4 is a schematic view illustrating a photoelectric device package according to another embodiment of the invention.

FIG. 4 is a schematic view illustrating a photoelectric device package according to another embodiment of the invention. With reference to FIG. 4, the difference between the photoelectric device package 400 described in this embodiment and the photoelectric device package 100 depicted in FIG. 1C lies in that the second substrate part 424 and the second carrying part 422 of the photoelectric device package 400 depicted in FIG. 4 are integrally formed. Hence, in this embodiment, there is no alignment error between the second substrate part 424 and the second carrying part 422. The alignment error of the photoelectric device package 400 merely exists between the first carrying part 412 and the second carrying part 422 (approximately ±50 micrometers), between the first substrate part 414 and the first supporting portion 412 (approximately ±15 micrometers), and between the first substrate part 414 and the second substrate part 424 (approximately ±5 micrometers).

Figure 5A:
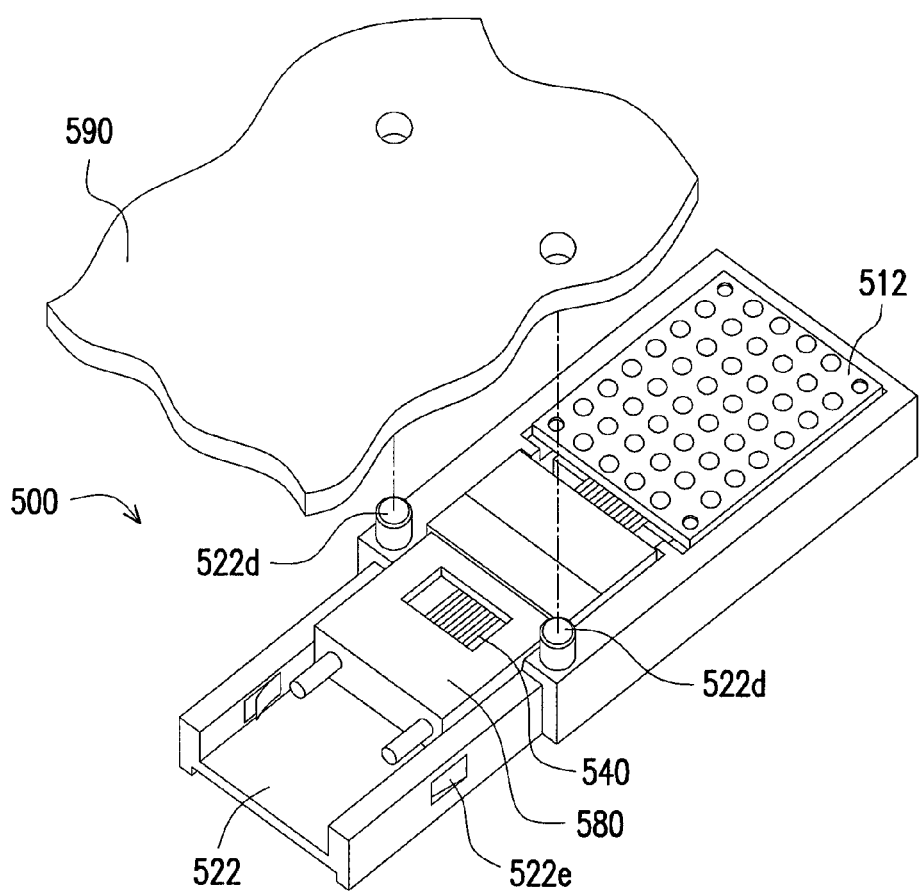
FIG. 5A is a schematic view illustrating a photoelectric device package according to another embodiment of the invention.
Figure 5B:
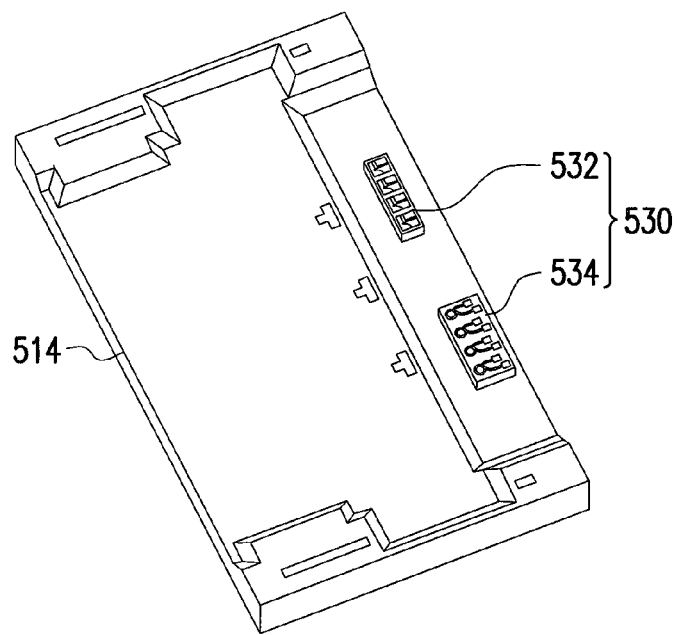
FIG. 5B is a schematic view illustrating the first substrate part in the photoelectric device package depicted in FIG. 5A.

FIG. 5A is a schematic view illustrating a photoelectric device package according to another embodiment of the invention. FIG. 5B is a schematic view illustrating the first substrate part in the photoelectric device package depicted in FIG. 5A. With reference to FIG. 5A and FIG. 5B, the photoelectric device 530 described in this embodiment includes a light-emitting element 532 and a photo-sensitive element 534, and the photoelectric device 530 may be die-attached to the first substrate part 514. The light-emitting element 532 may be vertical cavity surface emitting laser (VCSEL) for transmitting an optical signal to the light-guiding element 540. The photo-sensitive element 534 may be a photo-diode for receiving the optical signal from the light-guiding element 540. Certainly, the types and the configuration of the light-emitting element 532 and the photo-sensitive element 534 are not limited to the above.

Figure 5C:
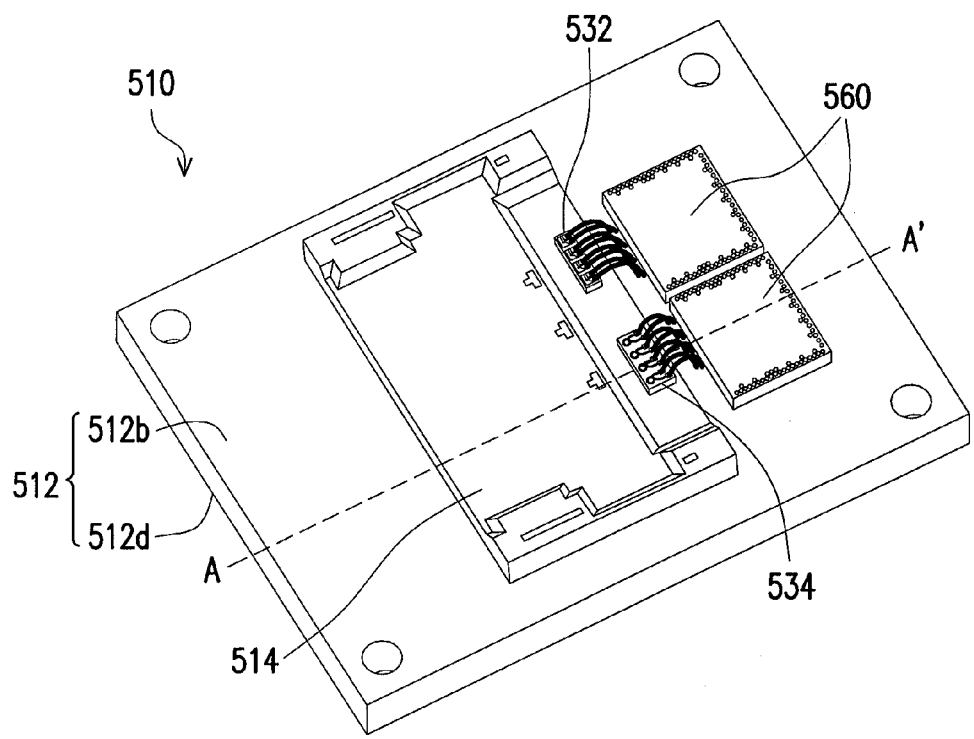
FIG. 5C is a schematic view illustrating the bottom-plate in the photoelectric device package depicted in FIG. 5A.
Figure 5D:
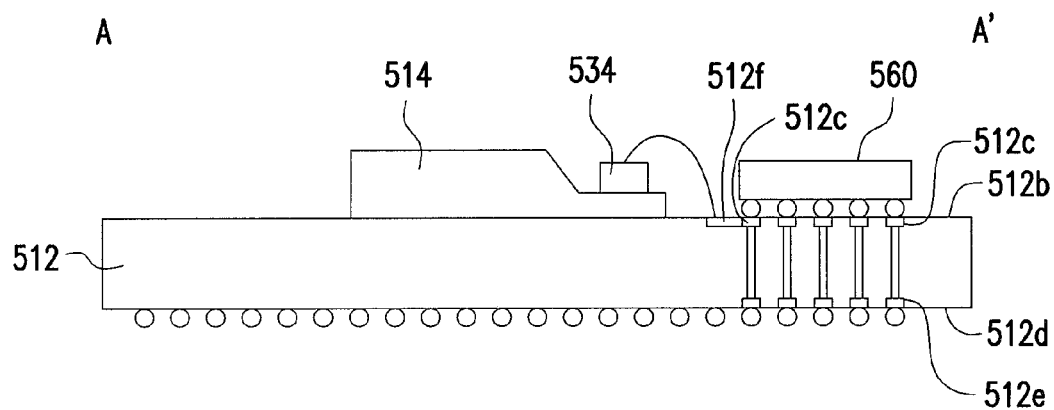
FIG. 5D is a schematic cross-sectional view illustrating the bottom-plate depicted in FIG. 5C along a line segment A-A'.

FIG. 5C is a schematic view illustrating the bottom-plate in the photoelectric device package depicted in FIG. 5A. FIG. 5D is a schematic cross-sectional view illustrating the bottom-plate depicted in FIG. 5C along a line segment A-A'. With reference to FIG. 5C and FIG. 5D, the first carrying part 512 of the bottom-plate 510 has a first surface 512b and a second surface 512d opposite to the first surface 512b. The first surface 512b has a plurality of first pads 512c and third pads 512f thereon, the second surface 512d has a plurality of second pads 512e, and the first pads 512c and the second pads 512e are electrically connected through through-silicon via (TSV). In this embodiment, the light-emitting element 532 and the photo-sensitive element 534 are connected to the third pads 512f of the first surface 512b through wire bonding, and the third pads 512f are connected to the first pads 512c. Driver dies 560 are connected to the first pads 512c of the first surface 512b through solder balls. The light-emitting element 532 and the photo-sensitive element 534 are electrically connected to the driver dies 560 configured on the first surface 512b of the first carrying part 512 through the third pads 512f and the first pads 512*c*. Besides, the light-emitting element 532 and the photo-sensitive element 534 are electrically connected to the solder balls of the second pads 512*e* on the second surface 512*d* through the TSVs and the second pads 512*e*.

The main difference between the photoelectric device package 500 depicted in FIG. 5A and the photoelectric device package 100 depicted in FIG. 1C lies in that the photoelectric device package 500 depicted in FIG. 5A further includes an adapting element 580 that is connected to the light-guiding element 540. Here, the adapting element 580 may be a mechanic adapting ferrule, the second carrying part 522 carries the adapting element 580, and the adapting element 580 is not covered by the first carrying part 512. The second carrying part 522 further has a plurality of positioning portions 522*d* that are alignment pins, for instance, and the positioning portions 522*d* are not covered by the first carrying part 512 and are suitable for being fixed onto a third carrying part 590. The second carrying part 522 may be aligned to the third carrying part 590 through the positioning portions 522*d*. As shown in FIG. 5A and FIG. 5C, the positioning portions 522*d* are located on the second carrying part 522 relatively away from the driver dies 560 on the first carrying part 512; thereby, the positioning portions 522*d* will not affect the high-frequency circuits close to the driver dies 560 on the first carrying part 512, and thus circuit abnormality may not occur.

Figure 5E:
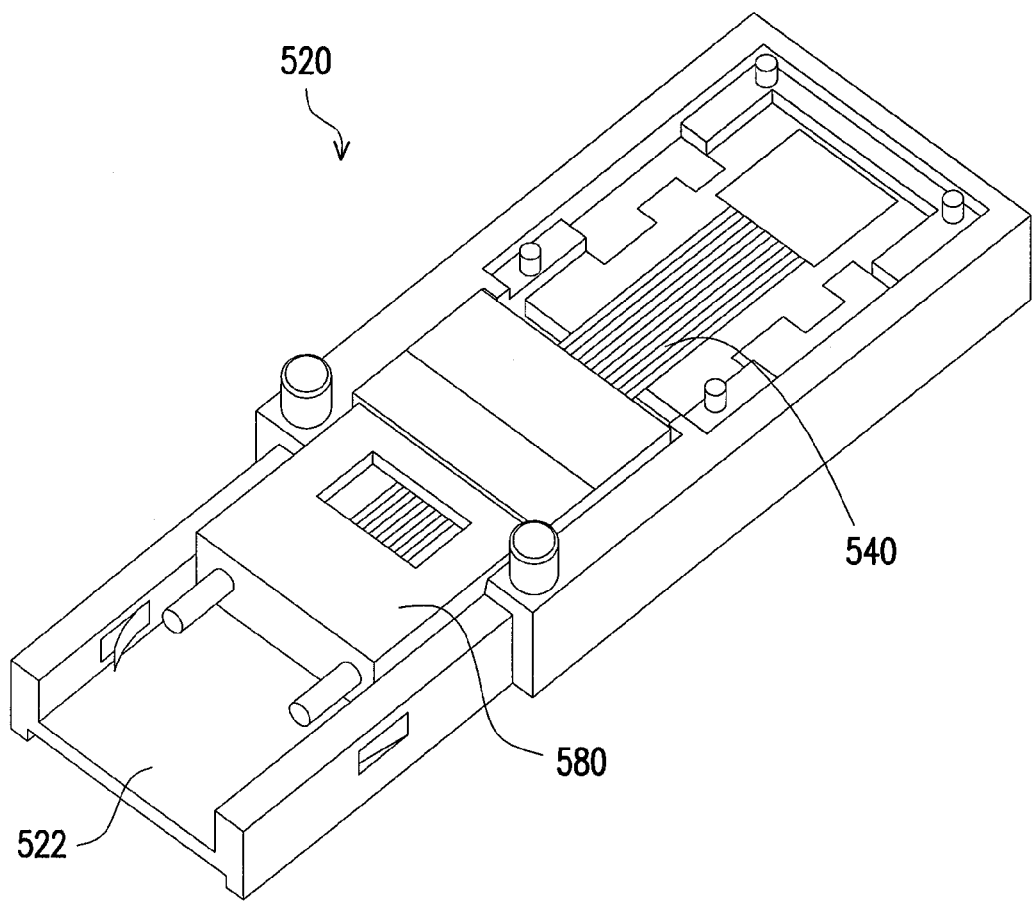
FIG. 5E is a schematic view illustrating that the bottom-plate in the photoelectric device package depicted in FIG. 5A has an adapting element.
Figure 5F:
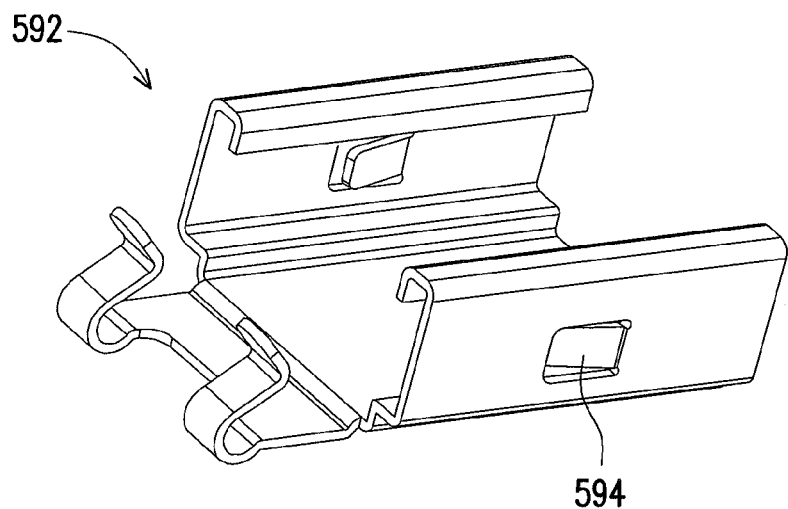
FIG. 5F is a schematic view illustrating a fastener in the photoelectric device package depicted in FIG. 5A.
Figure 5G:
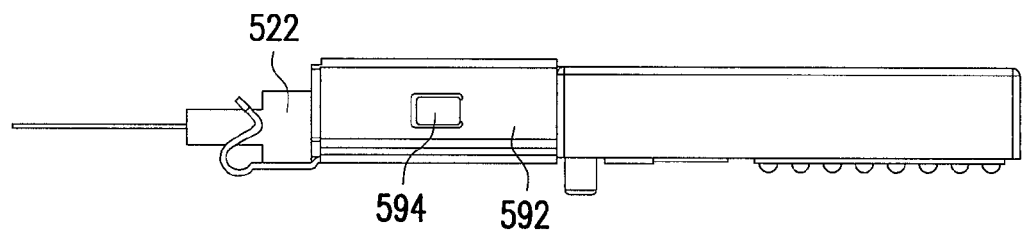
FIG. 5G is a schematic side view illustrating that the photoelectric device package depicted in FIG. 5A has a fastener.

FIG. 5E is a schematic view illustrating that the bottom-plate in the photoelectric device package depicted in FIG. 5A has an adapting element. FIG. 5F is a schematic view illustrating a fastener in the photoelectric device package depicted in FIG. 5A. FIG. 5G is a schematic side view illustrating that the photoelectric device package depicted in FIG. 5A has a fastener. Another difference between the photoelectric device package 500 depicted in FIG. 5A and the photoelectric device package 100 depicted in FIG. 1C lies in that the photoelectric device package 500 further includes a fastener 592 that is fastened to the second carrying part 522, as shown in FIG. 5F. Here, the second carrying part 522 has at least one first mortise tenon joint 522*e*, and the fastener 592 has a second mortise tenon joint 594. The fastener 592 is fastened to the second carrying part 522 through the first mortise tenon joint 522*e* and the second mortise tenon joint 594, as shown in FIG. 5G.

Figure 6A:
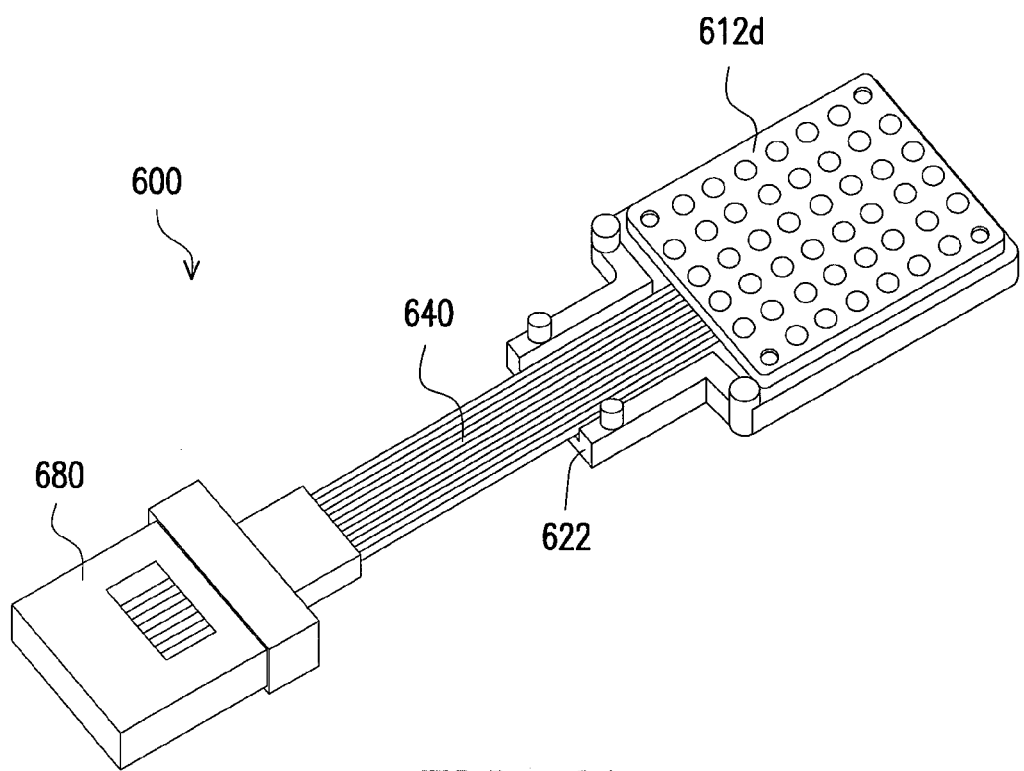
FIG. 6A is a schematic view illustrating a photoelectric device package according to another embodiment of the invention.
Figure 6B:
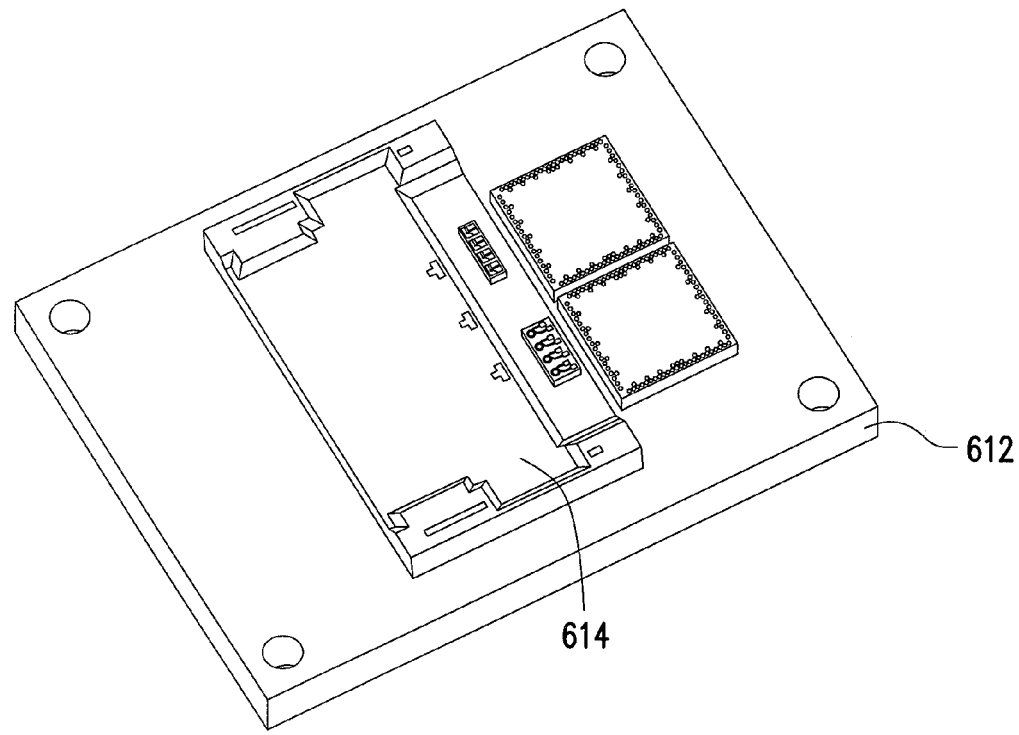
FIG. 6B is a schematic view illustrating the bottom-plate in the photoelectric device package depicted in FIG. 6A.
Figure 6C:
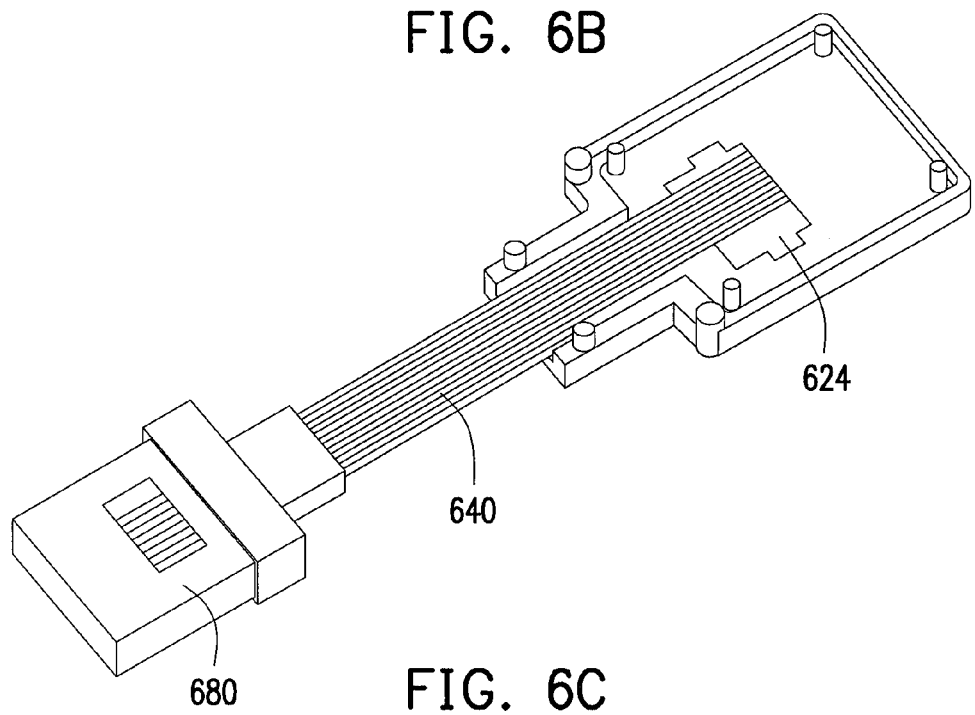
FIG. 6C is a schematic view illustrating the top-plate in the photoelectric device package depicted in FIG. 6A.

FIG. 6A is a schematic view illustrating a photoelectric device package according to another embodiment of the invention. FIG. 6B is a schematic view illustrating the bottom-plate in the photoelectric device package depicted in FIG. 6A. FIG. 6C is a schematic view illustrating the top-plate in the photoelectric device package depicted in FIG. 6A. With reference to FIG. 6A to FIG. 6C, the main difference between the photoelectric device package 600 described herein and the photoelectric device package 500 lies in that the light-guiding element 640 of the photoelectric device package 600 depicted in FIG. 6A extends from a space between the first substrate part 614 and the second substrate part 624 to a region outside the second carrying part 622, and the adapting element 680 is not covered by the first carrying part 612.

Figure 7A:
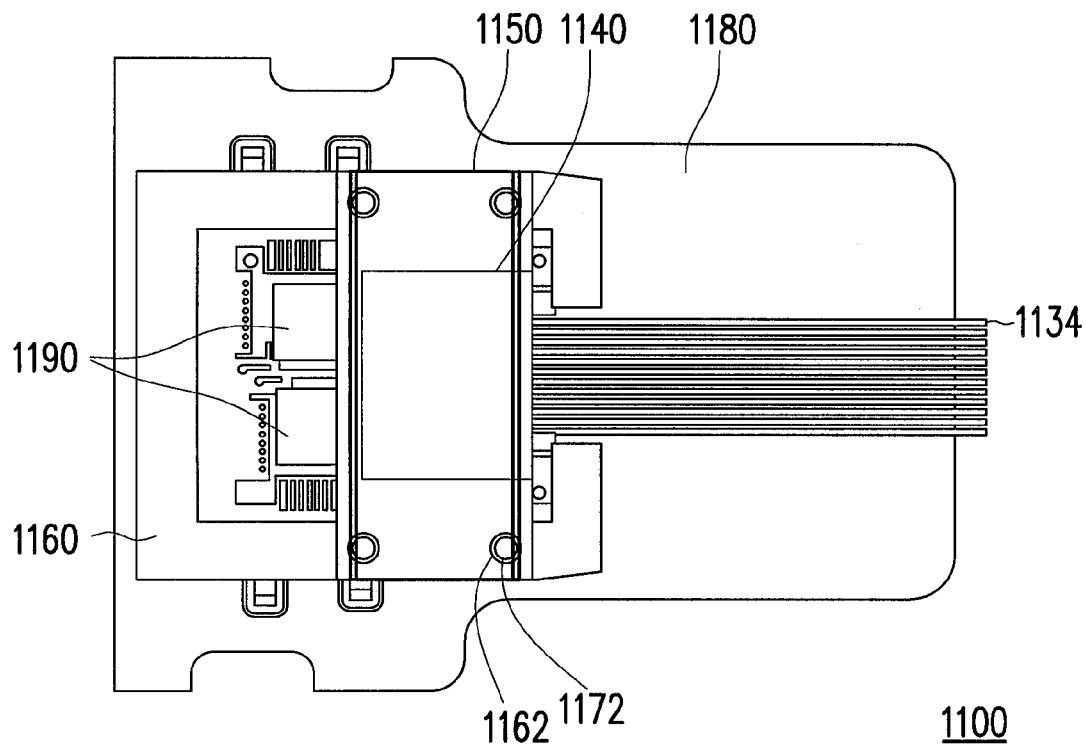
FIG. 7A is a top view illustrating a detachable package structure according to an embodiment of the invention.
Figure 7B:
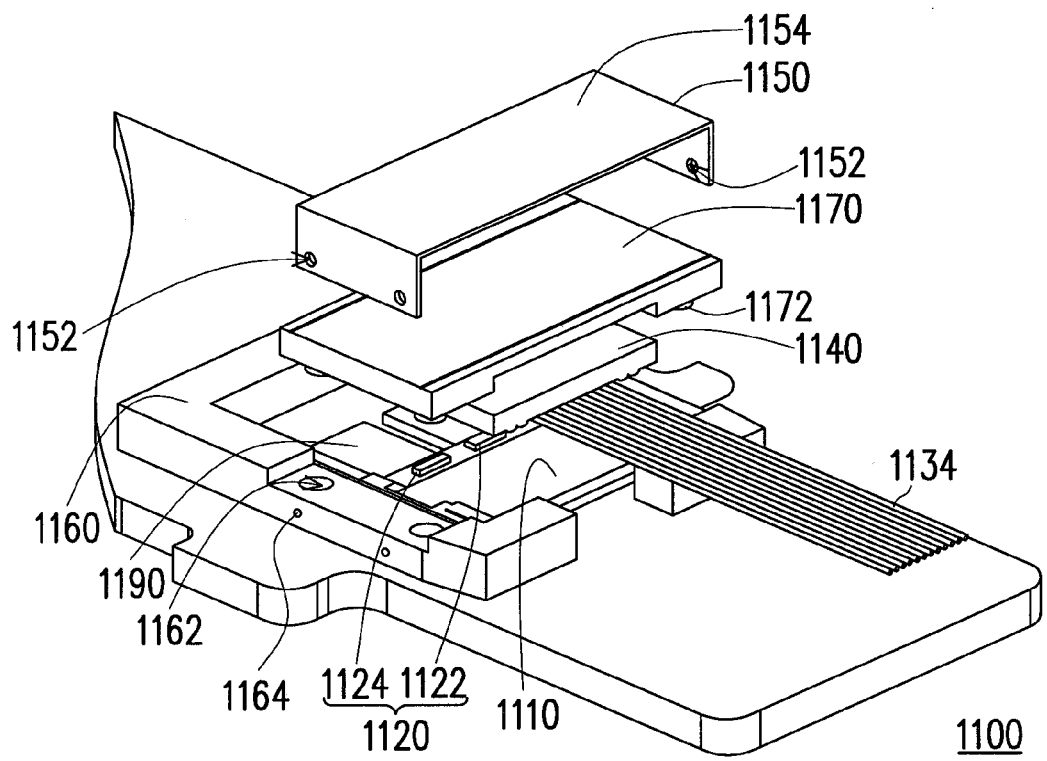
FIG. 7B is a three-dimensional exploded view illustrating the detachable package structure depicted in FIG. 7A.
Figure 7C:
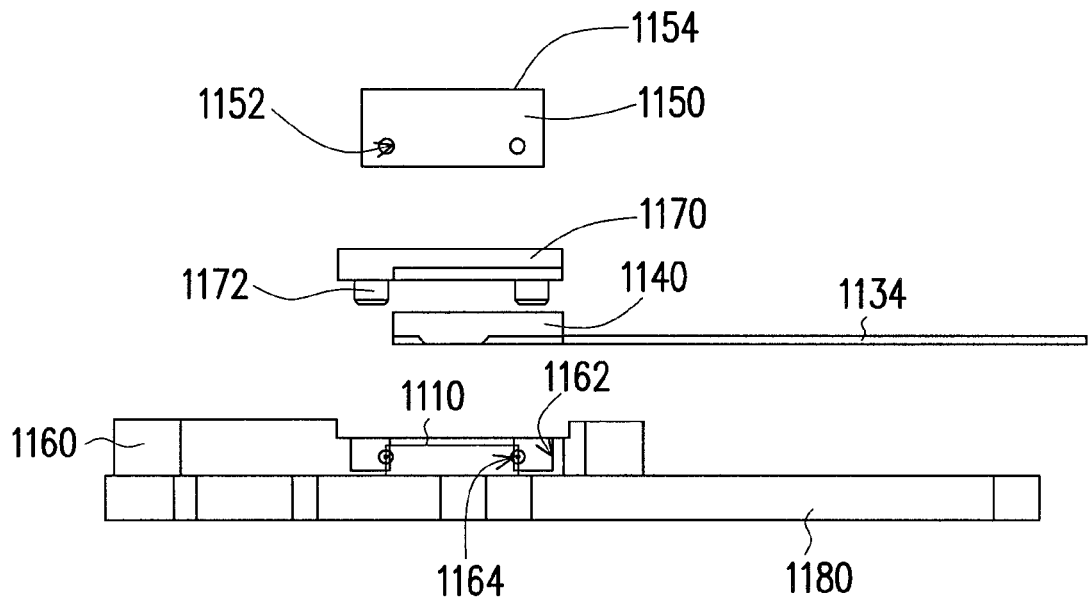
FIG. 7C and FIG. 7D are exploded side views illustrating the detachable package structure depicted in FIG. 7A at two different viewing angles.
Figure 7D:
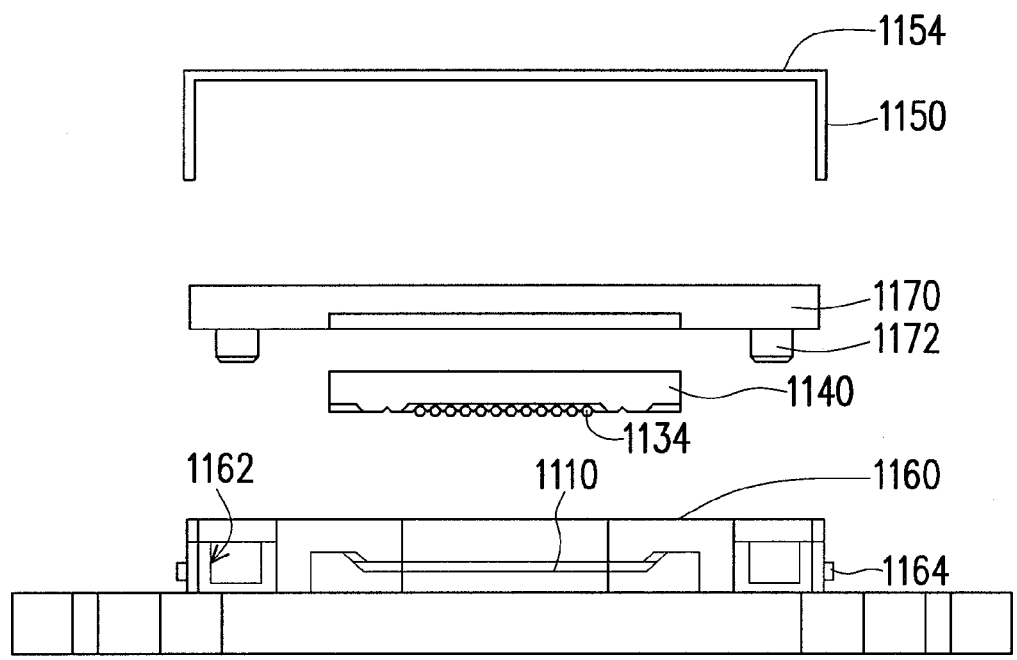
Figure 8:
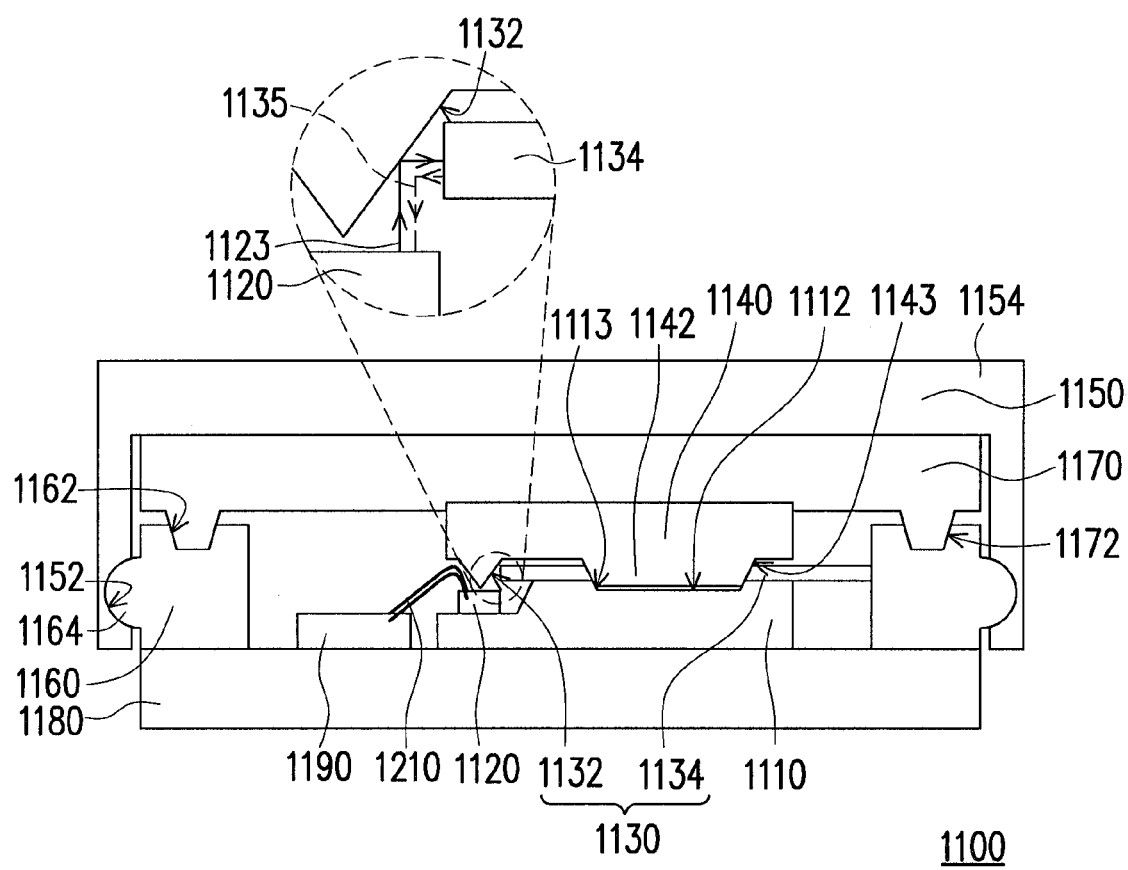
FIG. 8 is a schematic view illustrating the detachable package structure depicted in FIG. 7A.
Figure 9A:
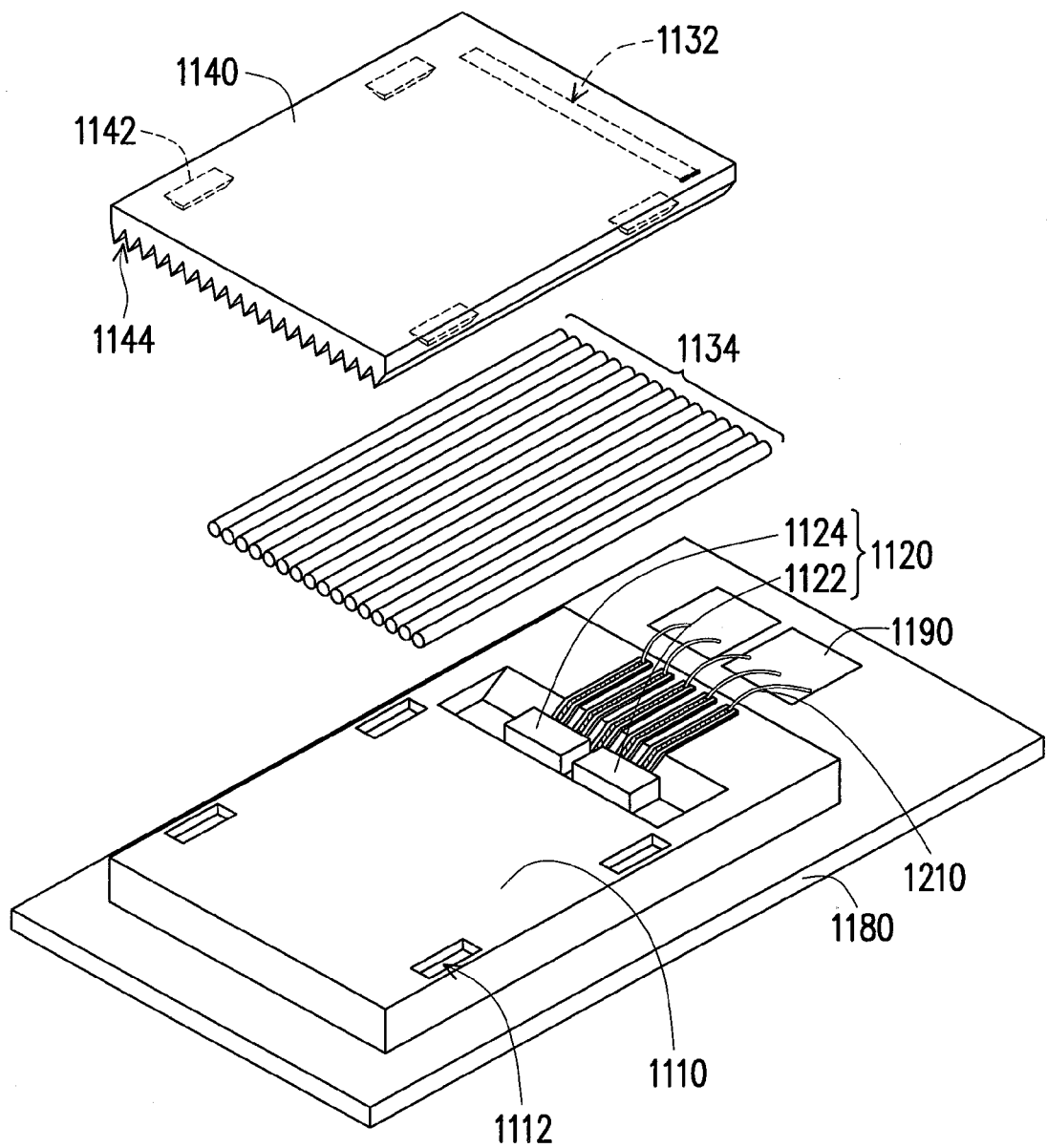
FIG. 9A is an exploded view illustrating the first substrate, the second substrate, and their alignment portions depicted in FIG. 7A.

FIG. 7A is a top view illustrating a detachable package structure according to an embodiment of the invention. FIG. 7B is a three-dimensional exploded view illustrating the detachable package structure depicted in FIG. 7A. FIG. 7C and FIG. 7D are exploded side views illustrating the detachable package structure depicted in FIG. 7A at two different viewing angles. FIG. 8 is a schematic view illustrating the detachable package structure depicted in FIG. 7A. FIG. 9A is an exploded view illustrating the first substrate, the second substrate, and their alignment portions depicted in FIG. 7A.

Figure 9B:
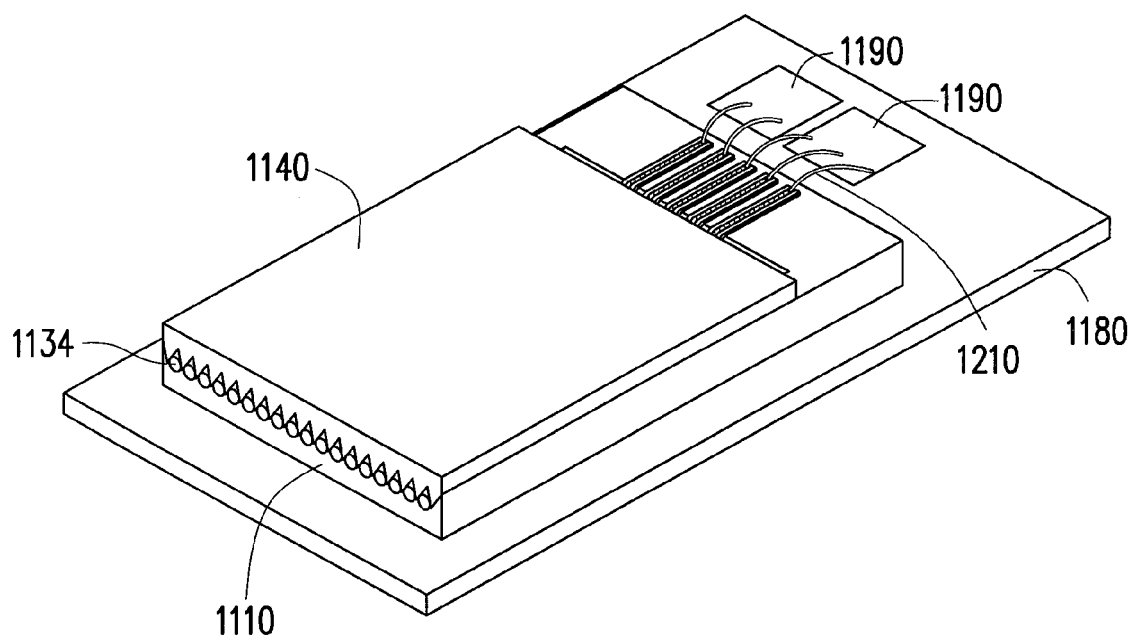
FIG. 9B is a three-dimensional view illustrating the first substrate, the second substrate, and their alignment portions depicted in FIG. 7A.

FIG. 9B is a three-dimensional view illustrating the first substrate, the second substrate, and their alignment portions depicted in FIG. 7A. Here, FIG. 8 is a schematic view illustrating the detachable package structure depicted in FIG. 7A; therefore, relative positions of elements depicted in FIG. 8 in a three-dimensional space may be referred to as those illustrated in FIG. 7A to FIG. 7D, FIG. 9A, and FIG. 9B. As shown in FIG. 7A to FIG. 7D, FIG. 8, FIG. 9A, and FIG. 9B, the detachable package structure 1100 includes a first substrate 1110, a second substrate 1140, and a combination element 1150. In this embodiment, the detachable package structure 1110 further includes an assembly substrate 1180 on which the first substrate 1110 is disposed. The first substrate 1110 may have at least one first alignment portion 1112, and the second substrate 1140 may have at least one second alignment portion 1142. In FIG. 9A, plural first alignment portions 1112 are exemplarily shown. According to this embodiment, the first substrate 1110 and the second substrate 1140 are both semiconductor substrates, e.g., silicon substrates, the first alignment portions 1112 may be recessions, and the second alignment portions 1142 may be protrusions. However, in another embodiment of the invention, the first alignment portions 1112 may be protrusions, and the second alignment portions 1142 may be recessions. In this embodiment, the first alignment portions 1112 and the second alignment portions 1142 may be formed by performing a silicon etching process. However, in other embodiments of the invention, the first substrate 1110 and the second substrate 1140 may be made of other semiconductors, and the first alignment portions 1112 and the second alignment portions 1142 may be formed by performing other semiconductor processes. The combination element 1150 described herein allows the first substrate 1110 and the second substrate 1140 to be detachably combined together, such that the first alignment portions 1112 and the second alignment portions 1142 may be aligned and combined (e.g., the first alignment portions 1112 may be inserted in the second alignment portions 1142). For instance, when the first alignment portions 1112 are recessions, and the second alignment portions 1142 are protrusions, the second alignment portions 1142 may be inserted in the first alignment portions 1112.

In this embodiment, the detachable package structure 1110 further includes a photoelectric conversion unit 1120 and an optical unit 1130. The photoelectric conversion unit 1120 is disposed on the first substrate 1110 and includes at least one of a light-emitting element 1122 and a photo-sensitive element 1124. In FIG. 9A, the photoelectric conversion unit 1120 exemplarily includes both the light-emitting element 1122 and the photo-sensitive element 1124. In this embodiment, the light-emitting element 1122 is a light-emitting die which may be a laser diode, e.g., a surface emitting laser diode. Besides, the photo-sensitive element 1124 may be a photo-sensitive die, e.g., a photo-diode. However, in another embodiment of the invention, the light-emitting element 122 may be a light-emitting diode (LED). Besides, the assembly substrate 1180 is a circuit board, for instance, and the photoelectric conversion unit 1120 may be electrically connected to the assembly substrate 1180. Specifically, the photoelectric conversion unit 1120 may be electrically connected to the driver circuit (e.g., a driver integrated circuit, a driver IC) 1190 on the assembly substrate 1180, and the driver circuit 1190 is electrically connected to the assembly substrate 1180. In this embodiment, the photoelectric conversion unit 1120 is connected to the driver circuit 1190 through a connection line 1210. However, the photoelectric conversion unit 1120 in other embodiments may be electrically connected to the driver circuit 1190 through a circuit on the assembly substrate 1180 or may be electrically connected to the driver circuit 1190 in other ways.

The optical unit 1130 is disposed between the first substrate 1110 and the second substrate 1140 and optically coupled to the photoelectric conversion unit 1120. The combination element 1150 allows the first substrate 1110 and the second substrate 1140 to be detachably combined, so as to fix a relative position of the photoelectric conversion unit 1120 and the optical unit 1130.

The optical unit 1130 includes a reflective surface 1132 and at least one light transmission element 1134, and the at least one light transmission element 1134 refers to plural light transmission elements 1134 in this embodiment, for instance. The reflective surface 1132 is located on the second substrate 1140. In this embodiment, the reflective surface 1132 is formed by a reflective coating on the second substrate 1140. The reflective coating is a metal coating or a coating made of other materials, and a reflectance of the reflectance coating may be greater than a reflectance of the second substrate 1140 made of silicon. The light transmission elements 1134 are optical fibers, for instance. However, in another embodiment, the light transmission elements 1134 may be wave guides.

Here, the light transmission elements 1134 are sandwiched between the first substrate 1110 and the second substrate 1140. In particular, when the combination element 1150 allows the first substrate 1110 and the second substrate 1140 to be combined together, the light transmission elements 1134 are sandwiched by the first substrate 1110 and the second substrate 1140. For instance, as shown in FIG. 9A, the second substrate 1140 may have a plurality of grooves 1144. When the light transmission elements 1134 are sandwiched by the first substrate 1110 and the second substrate 1140, the light transmission elements 1134 are held by the grooves 1144. In other embodiments, the first substrate 1110 may have the grooves that may hold the light transmission elements 1134, or both the first substrate 1110 and the second substrate 1140 have the grooves that may hold the light transmission elements 1134.

The light transmission elements 1134, the reflective surface 1132, and the photoelectric conversion unit 1120 are located on the same light path. According to this embodiment, the reflective surface 1132 reflects the light emitted from the light-emitting element 1122 to some of the light transmission elements 1134 (i.e., several of the light transmission elements 1134), while the reflective surface 1132 reflects the light 1135 emitted from the other light transmission elements 1134 to the photo-sensitive element 1124.

In this embodiment, the detachable package structure 1110 further includes a first positioning element 1160 and a second positioning element 1170. The first positioning element 1160 is disposed on the assembly substrate 1180 and has at least one third alignment portion 1162. The second positioning element 1170 has at least one fourth alignment portion 1172. In FIG. 7A, the first positioning element 1160 exemplarily has a plurality of third alignment portions 1162, and the second positioning element 1170 exemplarily has a plurality of fourth alignment portions 1172. The fourth alignment portions 1172 and the third alignment portions 1162 are aligned and combined. Here, the fourth alignment portions 1172 are protrusions, for instance, and the third alignment portions 1162 are recessions, for instance. However, in another embodiment of the invention, the fourth alignment portions 1172 may be recessions, and the third alignment portions 1162 may be protrusions. Besides, the fourth alignment portions 1172 may be combined with (e.g., may be inserted in) the third alignment portions 1162. The second substrate 1140 is disposed on the second positioning element 1170 and located between the second positioning element 1170 and the first substrate 1110. In this embodiment, the first positioning element 1160 and the second positioning element 1170 are plastic elements formed by injection molding, for instance. Besides, an alignment error between the third alignment portions 1162 and the fourth alignment portions 1172 is greater than an alignment error between the first alignment portions 1112 and the second alignment portions 1142. Since the precision degree of the semiconductor process (e.g., the silicon etching process) is greater than that of the injection molding process, the alignment error between the first alignment portions 1112 and the second alignment portions 1142 may be relatively insignificant.

In this embodiment, the combination element 1150 has at least one first locking portion 1152, and the first positioning element 1160 has at least one second locking portion 1164. In FIG. 7B, a plurality of first locking portions 1152 and a plurality of second locking portions 1164 are shown. The combination element 1150 locks the second locking portions 1164 through the first locking portions 1152, such that the second positioning element 1170 and the first positioning element 1160 may be detachably combined, and that the second substrate 1140 and the first substrate 1110 may be detachably combined. Namely, the combination element 1150 is a locking element. When the combination element 1150 locks the first positioning element 1160, the top 1154 of the combination element 1150 presses the second positioning element 1170. Thereby, the second positioning element 1170 presses the first positioning element 1160 and the second substrate 1140, and the second substrate 1140 then presses the first substrate 1110. Due to the clamping force between the first substrate 1110 and the second substrate 1140, the light transmission elements 1134 may be fixed at proper positions. According to this embodiment, the first locking portions 1152 are recessions or through holes, and the second locking portions 1164 are protrusions, for instance. Nonetheless, in another embodiment of the invention, the first locking portions 1152 may be protrusions, and the second locking portions 1164 may be recessions or through holes.

Figure 10A:
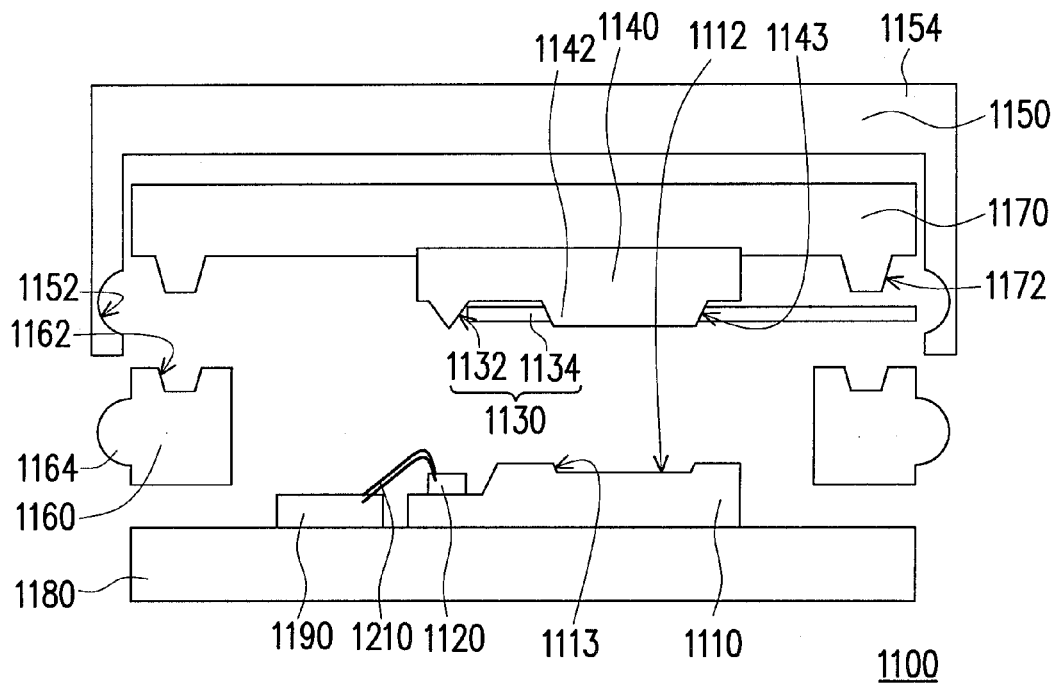
FIG. 10A and FIG. 10B illustrate a process of assembling the detachable package structure depicted in FIG. 8.
Figure 10B:
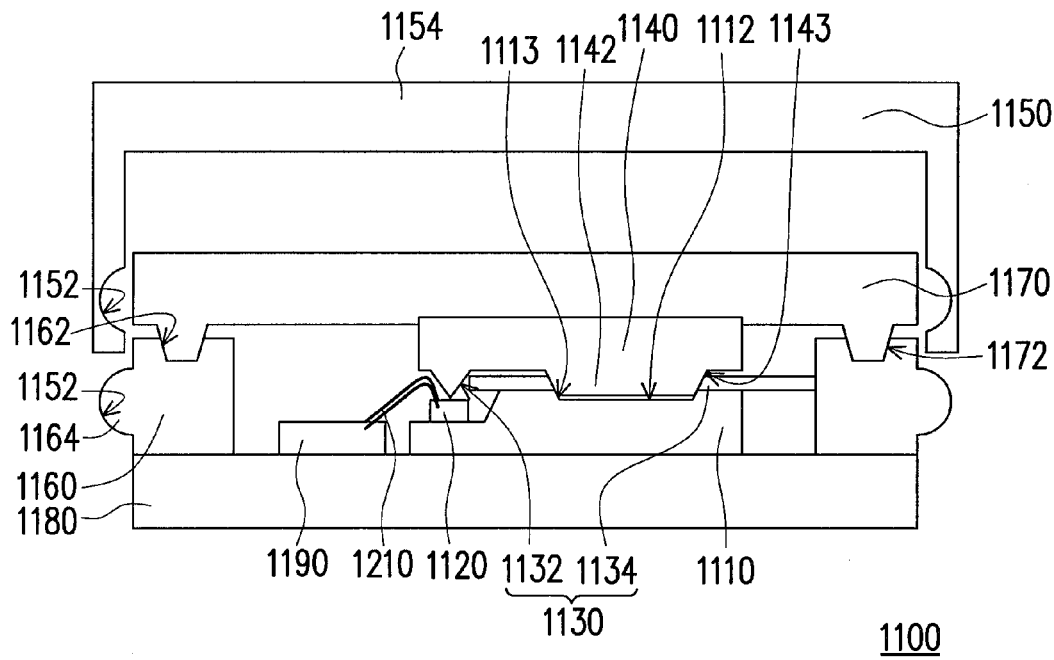

FIG. 10A and FIG. 10B illustrate a process of assembling the detachable package structure depicted in FIG. 8. The assembly process of the detachable package structure 1100 is described below. With reference to FIG. 10A, the first positioning element 1160 is fixed onto the assembly substrate 1180. For instance, the first positioning element 1160 is attached to the assembly substrate 1180 through using an adhesive, using an adhesive tape, or performing a die-attaching process. The fourth alignment portions 1172 are then aligned to the third alignment portions 1162, and the fourth alignment portions 1172 and the third alignment portions 1162 are locked together, as shown in FIG. 10B. When the fourth alignment portions 1172 and the third alignment portions 1162 are locked together, the first substrate 1110 and the second substrate 1140 may be roughly positioned. The first alignment portions 1112 and the second alignment portions 1142 may respectively have the tapered surfaces 1113 and the tapered surfaces 1143. Hence, when the fourth alignment portions 1172 and the third alignment portions 1162 are locked together, the first alignment portions 1112 of the first substrate 1110 and the second alignment portions 1142 of the second substrate 1140 may be precisely positioned because the tapered surfaces 1143 slide relatively to the tapered surfaces 1113. For instance, the second alignment portions 1142 reach the deepest parts of the first alignment portions 1112, and thereby the first substrate 1110 and the second substrate 1140 may be positioned in a more precise manner. The combination element 1150 then presses the second positioning element 1170 from top to bottom. Here, the combination element 1150 may be elastic; therefore, when the combination element 1150 then presses the second positioning element 1170 from top to bottom, the first locking portions 1152 slide to the positions of the second locking portions 1164 and are then locked to the second locking portions 1164. Owing to the locking force, the combination element 1150 is able to fix the second positioning element 1170 onto the first positioning element 1160 and fix the second substrate 1140 onto the first substrate 1110. Further, the light transmission elements 1134 are sandwiched by the second substrate 1140 and the first substrate 1110, so as to complete the packaging process of the detachable package structure 1100, as shown in FIG. 8. In this embodiment, the second substrate 1140 may adhere to the second positioning element 1170 before the second positioning element 1170 and the first positioning element 1160 are assembled. Thereby, when the second positioning element 1170 is assembled to the first positioning element 1160, the second substrate 1140 may be together assembled to the first substrate 1110.

In the detachable package structure described 1100 in this embodiment, the combination element 1150 allows the first substrate 1110 and the second substrate 1140 to be detachably combined, and the first alignment portions 1112 and the second alignment portions 1142 are allowed to be aligned and combined. Hence, the detachable package structure 1100 described herein may be easily disassembled, so as to replace defective or dysfunctional elements in the package structure. For instance, when the light transmission elements 1134 are broken in the packaging process, the combination element 1150 may be pulled in an upward direction and thus may be removed away from the second positioning element 1170. The second positioning element 1170, together with the second substrate 1140, is then pulled in an upward direction (relative to the first substrate 1110), so as to remove the broken light transmission elements 1134 and replace the broken ones with new ones. The packaging process is then again performed by sequentially implementing the steps shown in FIG. 10A, FIG. 10B, and FIG. 8. Even though the light transmission elements 1134 are found to be broken after the packaging process is completed, it is not necessary to discard the entire detachable package structure 1100, nor is it necessary to separate the second substrate 1140 from the first substrate 1110 through performing a complicated, expensive, and difficult process. Similarly, if the second substrate 1140, the second positioning element 1170, or the reflective surface 1132 is found to be defective or damaged after the packaging process is completed, the combination element 1150 may be removed to replace the second substrate 1140 and the second positioning element 1170. The costly elements, such as the photoelectric conversion unit 1120 and the driver circuit 1190, are disposed on the first substrate 1110 and the assembly substrate 1180, while there is no expensive element on the second substrate 1140 and the second positioning element 1170. Hence, the costs of the detachable package structure 1100 may be lowered down by replacing the second substrate 1140 and the second positioning element 1170 but maintaining the first substrate 1110 and the assembly substrate 1180.

Moreover, in the detachable package structure 1100 described in this embodiment, the fourth and third alignment portions 1172 and 1162 may be combined and roughly positioned, and the second and first alignment portions 1142 and 1112 may be precisely positioned. Therefore, the detachable package structure 1100 described herein may achieve the highly precise alignment between the first and second substrates 1110 and 1140 through passive alignment (also referred to as self alignment); furthermore, the highly precise alignment among the light transmission elements 1134, the reflective surface 1132, and the photoelectric conversion unit 1120 may be accomplished. As such, manually operating special clamping tools under a microscope for alignment is not necessary for the detachable package structure 1100 described in this embodiment; consequently, the use of the detachable package structure 1100 may reduce the manufacturing time, lower down the manufacturing costs, and improve the manufacturing reliability.

In the detachable package structure 1100 of this embodiment, the light-emitting element 1122 may serve as an optical signal emitter, and the photo-sensitive element 1124 may act as an optical signal receiver. The optical signal emitted by the light-emitting element 1122 may be transmitted to the external surroundings (e.g., to an external light transceiver) sequentially via the reflective surface 1132 and the light transmission elements 1134, and the optical signal from the external surroundings (e.g., from an external light transceiver) may be transmitted to the photo-sensitive element 1124 sequentially via the light transmission elements 1134 and the reflective surface 1132 and is then sensed by the photo-sensitive element 1124. Hence, the detachable package structure 1100 may act as an optical signal transceiver (i.e., a photoelectric conversion element) applicable to the field of light communication or may act as a microminiaturized package structure of a micro-electromechanical system (MEMS). For instance, the detachable package structure may be employed to an optical high definition multimedia interface (HDMI), Thunderbolt, a Light Peak connector, an active optical cable/an AOC transceiver, or the like.

According to this embodiment, the first substrate 1110 and the assembly substrate 1180 are individually formed, and so are the first positioning element 1160 and the assembly substrate 1180, the second substrate 1140 and the second positioning element 1170, and the combination element 1150 and the second positioning element 1170. Nevertheless, in other embodiments of the invention, the first substrate 1110 and the assembly substrate 1180 may be integrally formed, the first positioning element 1160 and the assembly substrate 1180 may be integrally formed (i.e., the first positioning element 1160 is a protrusion structure on the assembly substrate 1180), the second substrate 1140 and the second positioning element 1170 may be integrally formed, or the combination element 1150 and the second positioning element 1170 may be integrally formed. Alternatively, the second substrate 1140, the second positioning element 1170, and the combination element 1150 may be integrally formed.

Figure 11:
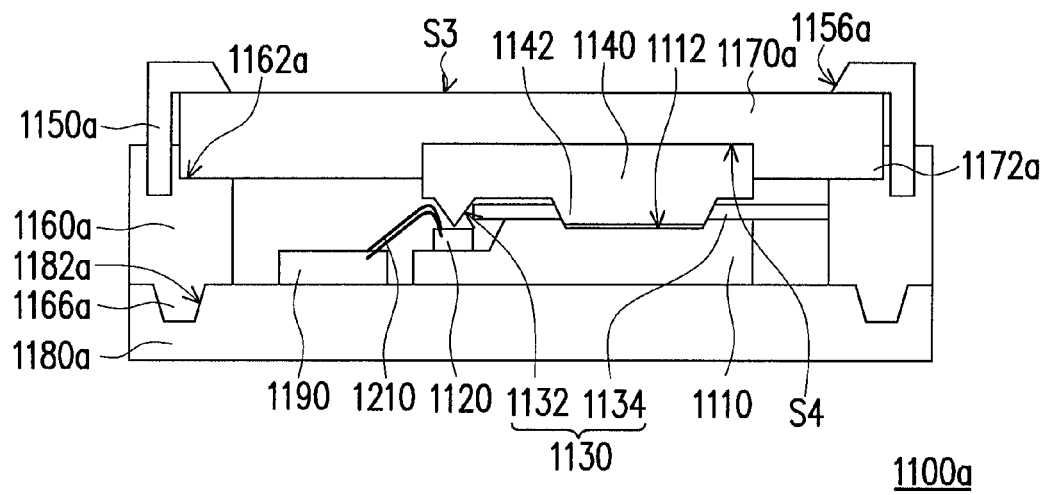
FIG. 11 is a schematic view illustrating a detachable package structure according to another embodiment of the invention.

FIG. 11 is a schematic view illustrating a detachable package structure according to another embodiment of the invention. With reference to FIG. 11, the detachable package structure 1100a described in this embodiment is similar to the detachable package structure 1100 depicted in FIG. 8, while the dissimilarities are described below. In the detachable package structure 1110a described in this embodiment, the combination element 1150a and the second positioning element 1170a are detachably combined. Particularly, according to this embodiment, the second positioning element 1170a has a third surface S3 and a fourth surface S4 opposite to the third surface S3, and the second substrate 1140 is disposed between the fourth surface S4 and the first substrate 1110. Besides, the combination element 1150a is a locking hook, and the locking hook extends from the first positioning element 1160a to the third surface S3 and locks the third surface S3, such that the second positioning element 1170a and the first positioning element 1160a are detachably combined. According to this embodiment, the combination element 1150a and the first positioning element 1160a are integrally formed. However, in other embodiments of the invention, the combination element 1150a may be inserted into or simply attached to the first positioning element 1160a. The third alignment portion 1162a of the first positioning element 1160a may be a bar-shaped indentation (exemplarily extending in a direction perpendicular to the direction of the drawings), and the fourth alignment portion 1172a refers to an edge of the second positioning element 1170a. When the first positioning element 1160a and the second positioning element 1170a are combined, the fourth alignment portion 1172a is placed in the third alignment portion 1162a.

According to this embodiment, the first positioning element 1160a has a first joint portion 1166a, the assembly substrate 1180a has a second joint portion 1182a, and the first joint portion 1166a and the second joint portion 1182a are jointed. Here, the first joint portion 1166a is a protrusion, and the second joint portion 1182a is a recession. However, in another embodiment of the invention, the first joint portion 1166a may be a recession, and the second joint portion 1182a may be a protrusion. Besides, the first joint portion 1166a and the second joint portion 1182a may be jointed through using an adhesive, using an adhesive tape, or performing a die-attaching process.

The first positioning element 1160a and the combination element 1150a may be slightly elastic; therefore, during the packaging process of the detachable package structure 1100, the second positioning element 1170a and the second substrate 1140 may be pressed down, such that the edge (e.g., the fourth alignment portion 1172a) of the second positioning element 1170a slides toward the first positioning element 1160a along a guiding surface 1156a (i.e., the tapered surface) of the combination element 1150a. At this time, the edge of the second positioning element 1170a passes through and pushes against the guiding surface 1156a and thus pushes the combination element 1150a to respective sides. When the second positioning element 1170a is continuously pressed down to combine the fourth alignment portion 1172a and the third alignment portion 1162a, the combination element 1150a is bounced back from the respective sides and locks the third surface S3. Thereby, the packaging process of the detachable package structure 1100 may be completed. When it is intended to remove the second positioning element 1170a, the combination element 1150a may be pushed toward respective sides to separate the second positioning element 1170a from the first positioning element 1160a. According to another embodiment, the combination element 1150a, the first positioning element 1160a, and the assembly substrate 1180a may be integrally formed.

Figure 12:
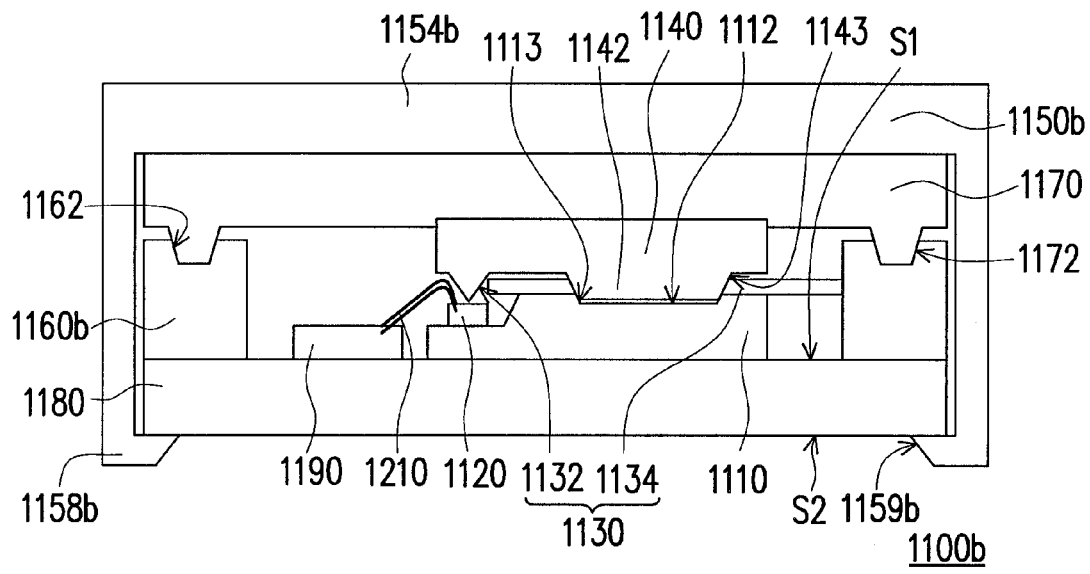
FIG. 12 is a schematic view illustrating a detachable package structure according to yet another embodiment of the invention.

FIG. 12 is a schematic view illustrating a detachable package structure according to yet another embodiment of the invention. With reference to FIG. 12, the detachable package structure 1100b described in this embodiment is similar to the detachable package structure 1100 depicted in FIG. 8, while the dissimilarities are described below. In the detachable package structure 1110b described in this embodiment, the combination element 1150b has a press portion 1154b and a locking hooking portion 1158b connected to the press portion 1154b. The assembly substrate 1180 has a first surface S1 and a second surface S2 opposite to the first surface S1. The first substrate 1110 is disposed on the first surface S1, and the second positioning element 1170 is disposed between the press portion 1154b and the first surface S1. The locking hook portion 1158b locks the second surface S2 of the assembly substrate 1180, such that the press portion 1154b presses the second positioning element 1170. During the packaging process of the detachable package structure 1100b described in this embodiment, the combination element 1150b is pressed down toward the second positioning element 1170. At this time, the guiding surface 1159b (e.g., a tapered surface) of the locking hook portion 1158b is pushed by the edge of the second positioning element 1170. Hence, when the combination element 1150b continues to be pressed down, the locking hook portion 1158b may be continuously moved downward to lock the second surface S2. When it is intended to remove the combination element 1150b, the locking hook portion 1158b may be pushed toward respective sides, and the combination element 1150b is lifted up and removed. Here, the combination element 1150b locks the second surface S2 through the locking hook portion 1158b, and the combination element 1150b need not be locked to the first positioning element 1160b.

To sum up, the photoelectric device package described in an embodiment of the invention may be a microminiaturized package structure applicable to an optical HDMI, an active optical cable/an AOC transceiver, or any other photoelectric conversion element. The top-plate and the bottom-plate of the photoelectric device package are assembled by the third alignment portions of the second carrying part and the first alignment portions of the first carrying part, and the first substrate part and the second substrate part are precisely positioned by the fourth alignment portions of the second substrate part and the second alignment portions of the first substrate part. Due to the dual alignment mechanism of the photoelectric device package as described herein, the top-plate and the bottom-plate may be accurately aligned in no need of any additional equipment, and thus the packaging process of the photoelectric device may be simplified.

In the detachable package structure described in an embodiment of the invention, the combination element allows the first semiconductor substrate and the second semiconductor substrate to be detachably combined, and the first alignment portion and the second alignment portion are allowed to be aligned and combined. Hence, the detachable package structure described herein may be easily disassembled, so as to replace defective or dysfunctional elements in the package structure. Besides, the combination element described in an embodiment of the invention allows the first substrate and the second substrate to be detachably combined, such that the relative position of the photoelectric conversion unit and the optical unit may be fixed. Due to the detachability of the detachable package structure, the photoelectric conversion unit and the optical unit in the package structure may be positioned, and the detachable package structure may be easily disassembled, so as to replace defective or dysfunctional elements in the package structure.

Moreover, in the detachable package structure described in an embodiment of the invention, the fourth and third alignment portions may be combined and roughly positioned, and the second and first alignment portions may be precisely positioned. Hence, the detachable package structure described herein may achieve the highly precise alignment between the first and second substrates through passive alignment (also referred to as self alignment); furthermore, the highly precise alignment among the light transmission element, the reflective surface, and the photoelectric conversion unit may be accomplished. As such, manually operating special clamping tools under a microscope for alignment is not necessary for the detachable package structure described herein. Consequently, the use of the detachable package structure described herein may reduce the manufacturing time, lower down the manufacturing costs, and improve the manufacturing reliability.

Although the invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. A photoelectric device package comprising:
a bottom-plate comprising:
a first carrying part having a plurality of first alignment portions; and
a first substrate part disposed on the first carrying part, the first substrate part having a plurality of second alignment portions;
a top-plate comprising:
a second carrying part having a plurality of third alignment portions, the top-plate and the bottom-plate being assembled by the first alignment portions and the third alignment portions; and
a second substrate part disposed on the second carrying part, the second substrate part having a plurality of fourth alignment portions, the first substrate part and the second substrate part being positioned by the second alignment portions and the fourth alignment portions;
at least one photoelectric device disposed on the first substrate part and located between the first substrate part and the second substrate part, wherein the at least one photoelectric device is capable of emitting or receiving an optical signal; and
at least one light-guiding element disposed between the first substrate part and the second substrate part, wherein the at least one light-guiding element is capable of transmitting the optical signal.

2. The photoelectric device package as recited in claim 1, wherein the first alignment portions are alignment holes, and the third alignment portions are alignment pins.

3. The photoelectric device package as recited in claim 1, wherein the second alignment portions are alignment indentations and the fourth alignment portions are alignment protrusions, or wherein the second alignment portions are alignment protrusions and the fourth alignment portions are alignment indentations.

4. The photoelectric device package as recited in claim 1, wherein the first substrate part further has a recession, the at least one photoelectric device is disposed on a bottom surface of the recession, and the second substrate part further has a reflective surface for reflecting the optical signal.

5. The photoelectric device package as recited in claim 1, wherein an alignment error between the first carrying part and the second carrying part is greater than an alignment error between the first substrate part and the second substrate part.

6. The photoelectric device package as recited in claim 5, wherein the alignment error between the first substrate part and the second substrate part is approximately ±5 micrometers, and the alignment error between the first carrying part and the second carrying part is approximately ±50 micrometers.

7. The photoelectric device package as recited in claim 1, wherein an alignment error between the first carrying part and the first substrate part is approximately ±15 micrometers, and an alignment error between the second carrying part and the second substrate part is approximately ±5 micrometers.

8. The photoelectric device package as recited in claim 1, further comprising an optical adhesive filling a space between the first substrate part and the second substrate part to encapsulate the at least one photoelectric device.

* * * * *